United States Patent
Huang et al.

(10) Patent No.: US 6,613,485 B2
(45) Date of Patent: Sep. 2, 2003

(54) OPTICAL PROXIMITY CORRECTION OF PATTERN ON PHOTORESIST THROUGH SPACING OF SUB PATTERNS

(75) Inventors: Jui-Tsen Huang, Taipei (TW); Jiunn-Ren Hwang, Tainan (TW)

(73) Assignee: United Microelectronics Crop., Hsinchu (TW)

( * ) Notice: Subject to any disclaimer, the term of this patent is extended or adjusted under 35 U.S.C. 154(b) by 52 days.

(21) Appl. No.: 10/045,432

(22) Filed: Jan. 11, 2002

(65) Prior Publication Data

US 2002/0086225 A1 Jul. 4, 2002

Related U.S. Application Data

(63) Continuation-in-part of application No. 09/570,743, filed on May 13, 2000, now abandoned, and a continuation-in-part of application No. 09/444,861, filed on Nov. 18, 1999, now Pat. No. 6,080,527.

(51) Int. Cl.$^7$ ............... G03F 9/00; G03C 5/00
(52) U.S. Cl. ............... 430/5; 430/30; 430/296; 430/942
(58) Field of Search ............... 430/5, 30, 296, 430/942

(56) References Cited

U.S. PATENT DOCUMENTS

| 5,792,581 A | * | 8/1998 | Ohnuma ............... 430/30 |
| 5,821,014 A | * | 10/1998 | Chen et al. ............... 430/30 |
| 5,858,591 A | * | 1/1999 | Lin et al. ............... 430/30 |
| 5,871,874 A | * | 2/1999 | Tounai ............... 430/30 |
| 5,879,844 A | * | 3/1999 | Yamamoto et al. ............... 430/30 |
| 6,080,527 A | * | 6/2000 | Huang et al. ............... 430/296 |

* cited by examiner

Primary Examiner—Christopher G. Young
(74) Attorney, Agent, or Firm—J.C. Patents

(57) ABSTRACT

An optical proximity correction method for rectifying pattern on photoresist. Line pattern of integrated circuit is divided into L-shape regions or T-shaped regions. The L-shaped or T-shaped regions are further dissected into rectangular patches. Area of each rectangular patch is suitably reduced and reproduced onto a photomask. The photomask is used to form a corrected photoresist pattern.

26 Claims, 5 Drawing Sheets

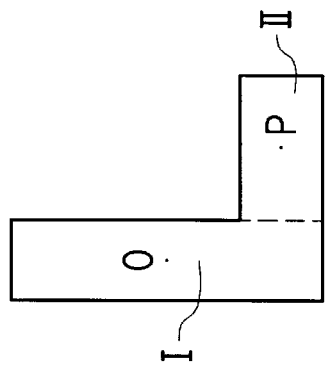
FIG. 3B
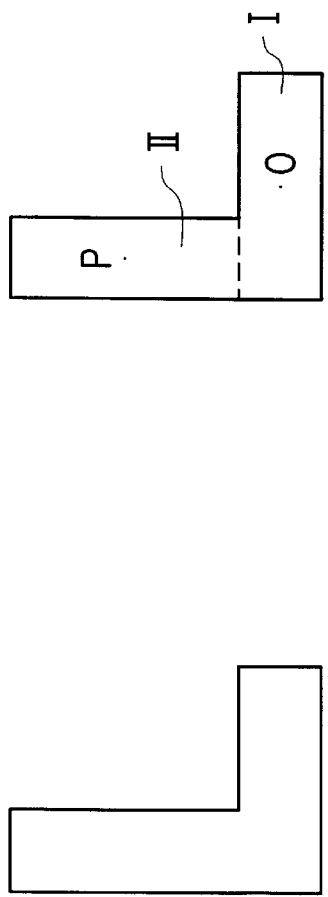
FIG. 3A
FIG. 2
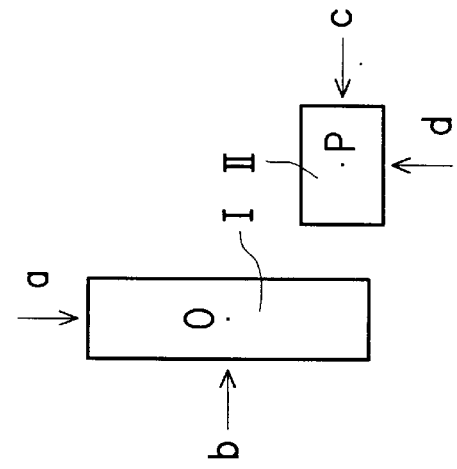
FIG. 4B
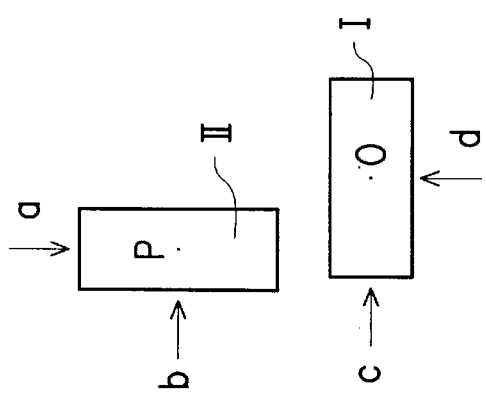
FIG. 4A

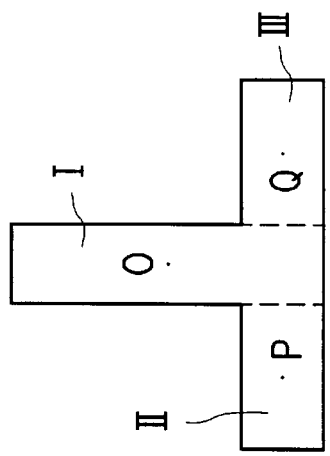
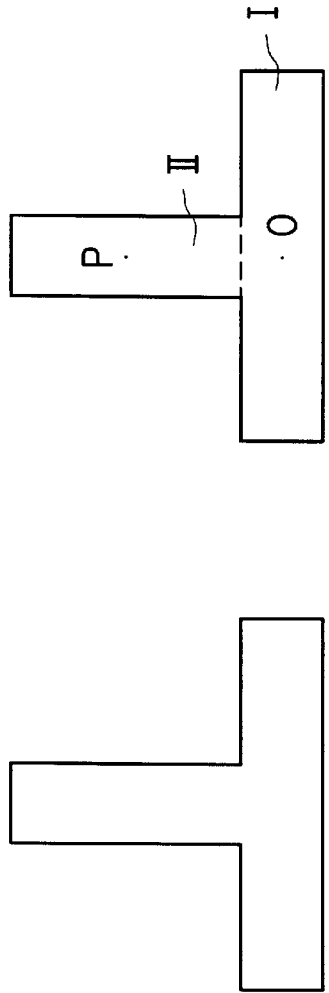
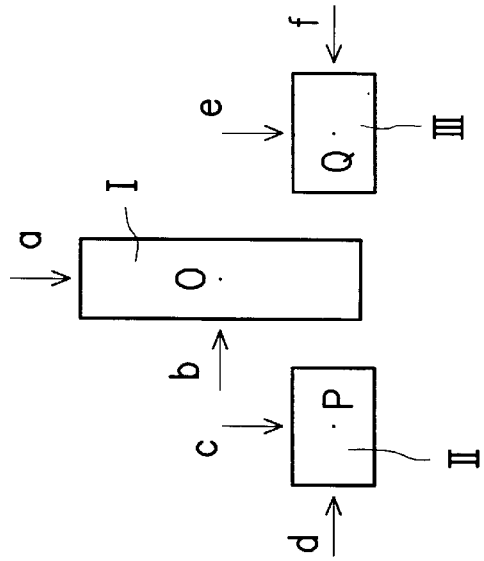
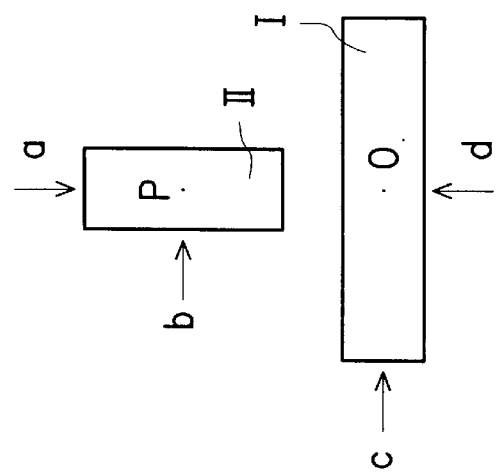

OPTICAL PROXIMITY CORRECTION OF PATTERN ON PHOTORESIST THROUGH SPACING OF SUB PATTERNS

CROSS-REFERENCE TO RELATED APPLICATION

This application is a continuation-in-part of prior applications Ser. No. 09/570,743, filed May 13, 2000 now ABN and Ser. No. 09/442,861, filed Nov. 18, 1999 now U.S. Pat. No. 6,080,527.

BACKGROUND OF THE INVENTION

1. Field of the Invention

The present invention relates to an optical proximity correction method. More particularly, the present invention relates to an optical proximity correction method for modifying the pattern on a photomask so that a higher photolithographic resolution is obtained.

2. Description of the Related Art

As the level of circuit integration continues to increase, dimensions of each electronic device must be reduced correspondingly. Photolithography is an important process in the fabrication of microelectronic devices on a wafer. Most structures associated with the fabrication metal-oxide-semiconductor (MOS) device such as patterned film layers and doped regions are closely related to the resolution of photolithographic processes. In fact, further increases in the level of circuit integration depend on our capacity to pattern out a line width smaller than 0.15 $\mu$m in photolithographic processes. To fabricate devices with such a small line width, methods such as optical proximity correction (OPC) and phase shift mask (PSM) have been developed.

The purpose of performing optical proximity correction is to eliminate deviations in critical dimensions from a desired pattern due to the optical proximity effect of pattern features. Proximity effect occurs when a light beam passes through the pattern of a photomask and projects onto a wafer. Due to the diffraction of the incoming light beam by the photomask, a portion of the light beam is diffused. Furthermore, some of the light will be reflected back from the surface of the photoresist layer, resulting in light interference. Consequently, over-exposure of light in some regions of the photoresist layer occurs, resulting in pattern distortion. This phenomenon becomes increasingly dominant as critical dimension decreases and wavelength of the light source approaches the critical dimension.

FIGS. 1A through 1D are schematic top views showing the steps for carrying out conventional optical proximity correction treatment. FIG. 1A is a top view of a photomask 100 showing an integrated circuit pattern with three rectangular masking regions 105 surrounded by a transparent region 110. Structurally, the photomask 100 consists of a chromium layer above a transparent substrate. Materials for forming the transparent substrate include glass and quartz. Area not covered by any chromium forms the transparent region 110, whereas areas covered by the chromium layer become the masking regions 105. FIG. 1B is a top view showing the resulting pattern when light is projected onto a substrate 120 through the photomask 100. A pattern with three dark regions 125 surrounded by a bright region 130 is formed. As shown in FIG. 1A, the original masking region 105 has a rectangular shape. However, the dark regions 125 on the substrate 120 transferred to a photoresist layer (as shown in FIG. 1B) display some shape distortion. Due to the diffraction of light, corners are rounded and deviated from the designed pattern. Moreover, other types of pattern distortions not shown in the figure are also possible. For example, when pattern density of the photomask is high, some features may merge, or alternatively, some features may deviate from the intended locations.

To compensate for the distortions, masking regions are sometimes expanded in places next to the corners and edges of the masking region 105. FIG. 1C is a top view showing a photomask with added masking regions 150 and 155. The additional masking region 150 at a corner is called a serif. The serif is able to reduce the degree of corner round formation in a pattern after photoresist exposure. The additional masking regions 155 are designed to reduce dimensional reduction due to diffraction or dispersion along the edges of a pattern. FIG. 1D is a top view of the pattern obtained on a substrate 120 after a photomask as shown in FIG. 1C is used in light projection. As shown in FIG. 1D, rounding at the corners of dark regions 125a has improved considerably.

However, the addition of masking areas to the masking pattern is not feasible when distance between neighboring features lines is small. A bottleneck is encountered because no more space is available for such compensation.

To form a photomask with higher resolution or a photomask with complicated features, optical correction using the aforementioned method is difficult. Hence, correction must be carried out with the aid of a computer. In general, data concerning the desired pattern on a semiconductor substrate is first stored inside a computer, and then iterative computation is carried out using conventional computer software. Ultimately, an optimal mask pattern is obtained. The optimal mask pattern is stored inside a computer. Finally, the ideal pattern is used to fabricate the photomask. When a light beam is shone on the photomask, an image that closely resembles the intended pattern is projected onto the semiconductor substrate.

Although computer programming is able to improve resolution of photomask, it can do so only up to a certain limit. For a pattern with ultra-fine features, the desired resolution may exceed the capability of the optical proximity correction method. Moreover, time-consuming computations have to be executed every time some modification to the pattern is need. The amount of time spent in processing large volumes of data and the necessary inspection of photomasks make mass-production of integrated circuits inconvenient.

SUMMARY OF THE INVENTION

The invention provides an optical proximity correction method applied to a photomask for rectifying distortion on photoresist. A method of designing a pattern on a mask comprises dividing the pattern into sub-patterns and rectifying an area of at least one of the sub-patterns to have the sub-patterns being spaced apart for modification on a light intensity distribution with respect to the pattern.

The foregoing sub-patterns include polygon shape, rectangular shape, trapezoid shape, or parallelogram shape.

The foregoing step of rectifying the area of the at least one of the sub-pattern includes OPC technique, halftone-mask technique, PSM technique, adding assist features, binary technique, chrome on glass technique, or levenson technique.

The invention also provides an optical proximity correction method applied to a photomask by dividing the pattern into sub-patterns, and relocating an area of at least one of the sub-patterns to have the sub-patterns being spaced apart for modifying a light intensity distribution with respect to the pattern.

The foregoing sub-patterns include polygon shape, rectangular shape, trapezoid shape, or parallelogram shape.

The foregoing step of rectifying the area of the at least one of the sub-pattern includes OPC technique, halftone-mask technique, PSM technique, adding assist features, binary technique, chrome on glass technique, or levenson technique.

Following the steps of this invention, an optical proximity corrected pattern can be obtained without too much computation. Hence, the method can simplify the production of photomasks and integrated circuits such that critical dimension can be further reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2 is a schematic top view showing a desired L-shaped pattern over a substrate;

FIGS. 3A and 3B are schematic top views showing two methods of dissecting the L-shaped pattern in FIG. 2;

FIGS. 4A and 4B are schematic top views showing the respective optical proximity corrected layouts of FIGS. 3A and 3B according to a first preferred embodiment of this invention;

FIG. 5A is a schematic top view showing a desired T-shaped pattern over the substrate in the active region of a dynamic random access memory;

FIGS. 5B and 5C are schematic top views showing two methods of dissecting the T-shaped pattern in FIG. 5A;

FIGS. 6A and 6B are schematic top views showing the respective optical proximity corrected layouts of FIGS. 5B and 5C according to a second preferred embodiment of this invention;

DESCRIPTION OF THE PREFERRED EMBODIMENTS

Figure 1A:
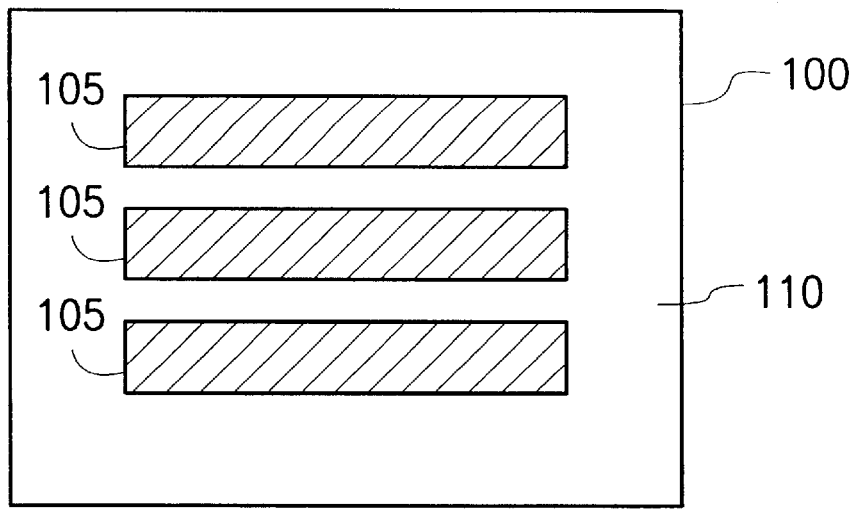
FIGS. 1A through 1D are schematic top views showing the steps for carrying out conventional optical proximity correction treatment.
Figure 1B:
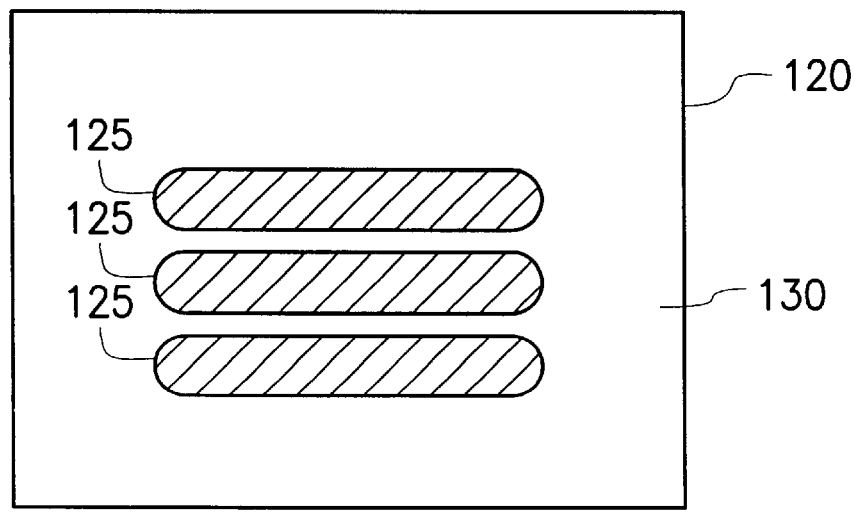
Figure 1C:
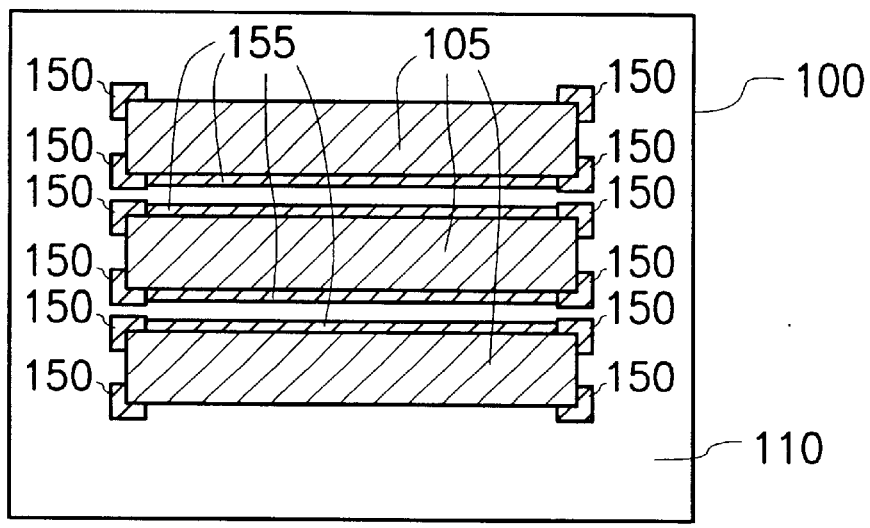
Figure 1D:
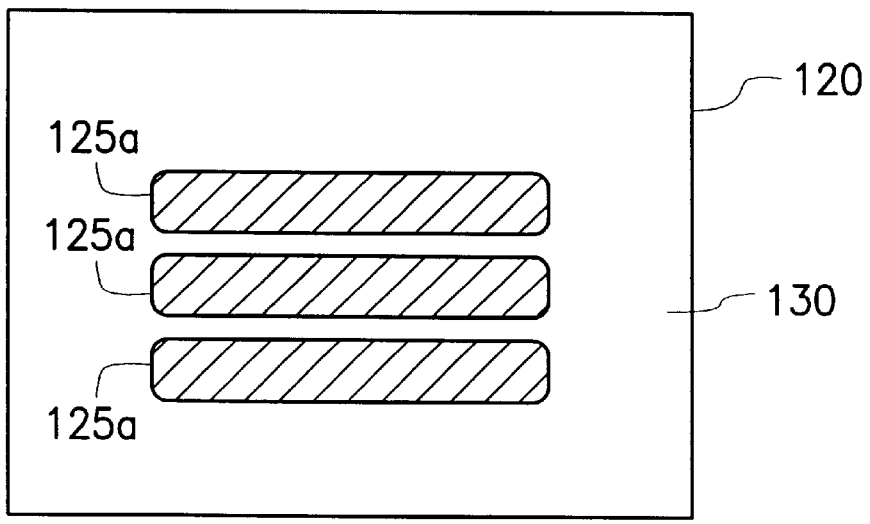

Reference will now be made in detail to the present preferred embodiments of the invention, examples of which are illustrated in the accompanying drawings. Wherever possible, the same reference numbers are used in the drawings and the description to refer to the same or like parts.

In this invention, the photomask is used for forming a light pattern on the photoresist material.

FIG. 2 is a schematic top view showing a desired L-shaped pattern over a substrate. The L-shaped pattern is first dissected to form two rectangular regions I and II. FIGS. 3A and 3B are schematic top views showing two methods of dissecting the L-shaped pattern in FIG. 2. As shown in FIG. 3B, the rectangular region I includes the corner region of the L-shaped patch. The rectangular region I has a shape center O in the middle. Similarly, the rectangular region II has a shape center P in the middle.

FIGS. 4A and 4B are schematic top views showing the respective optical proximity corrected layouts of FIGS. 3A and 3B according to a first preferred embodiment of this invention. For example, in FIG. 4A with respect to FIG. 3A, the region II is shorten from the concerning corner to the center P. In this manner, the region I and the region II are separated at the concerning corner. However, the region I can also be shorten by the same principle as the region II from the direction c. The width of the region I and II can, for example, also optionally reduced. Similarly, in FIG. 4B, the region II is shorten from the concerning corner. The region I may remain or be shorten by the same principle. As a result, the photoresist at the concerning corner is spaced apart and two sub regions I and II are formed. However, if it is necessary, the opposite edge to the corner edge can also be shorten to the shape center. This is a design choice under the principle of the invention.

The pattern as shown in FIG. 4A or 4B is reproduced onto a photomask and then the photomask is used to carry out the light exposure of photoresist. If the pattern on the photoresist layer matches the desired shape, the photomask pattern is optically correct. On the other hand, if the pattern on the photoresist deviates from the desired shape, any one or a combination of adjustments along the adjusting axes of a, b, c or d can be set. Another photomask is formed and then the photomask is used to expose a photoresist. The process is repeated until the pattern on the photoresist layer matches the desired shape.

FIG. 5A is a schematic top view showing a desired T-shaped pattern over the substrate in the active region of a dynamic random access memory. FIGS. 5B and 5C are schematic top views showing two methods of dissecting the T-shaped pattern in FIG. 5A.

As shown in FIG. 5B, the T-shaped pattern can be dissected into a first rectangular region I and a second rectangular region II. The first rectangular region I includes the intersecting region of the T-shaped patch. The second rectangular region II is on one side in the middle of the first rectangular region. The first rectangular region I has a shape center O in the middle. Similarly, the second rectangular region II has a shape center P in the middle.

FIGS. 6A is a schematic top view showing the corrected optical proximity layout of FIG. 5B according to a second preferred embodiment of this invention. As shown in FIG. 6A, length of the rectangular region II is, for example, reduced by modifying the concerning edge near the region I toward the shape center O. The region I may remain or be shorten by the same principle. As a result, the region I and the region II are spaced apart by a proper gap, which can improve the corner shape without being rounded. Similarly, in FIGS. 5C and 6B, the region I may remain or only a small amount of shrinkage. Instead, the region II and region III are shrunk by the same principle as describe above of the invention. As a result, the original pattern is divided into three sub-regions I, II, and III, which are properly spaced apart.

As shown in FIG. 5C, the T-shaped pattern is dissected into a first rectangular pattern I, a second rectangular pattern II and a third rectangular pattern III. The first rectangular region I includes the intersecting region of the T-shaped patch. The second rectangular region II and the third rectangular region III are on each side near the end of the first rectangular region I. The first rectangular region I has a shape center O in the middle, the second rectangular region II has a shape center P in the middle, and the third rectangular region III has a shaped center Q in the middle.

FIGS. 6B is a schematic top view showing the optical proximity corrected layout of FIG. 5C according to a second preferred embodiment of this invention. As shown in FIG. 6B, length of the rectangular region I along the line direction a is reduced by modifying edge near the regions II and III toward the shape center O. The width of the region I can optionally be reduced also. Similarly, length of the region II and region III can be reduced by modifying the concerning edges. As a result, the original region with T shape has been separated into three sub-regions, which are also spaced apart by a proper distance at the concerning edges.

The pattern as shown in FIG. 6A or 6B is reproduced onto a photomask and then the photomask is used to carry out the light exposure of photoresist. If the pattern on the photoresist layer matches the desired shape, the photomask pattern is optically correct. On the other hand, if the pattern on the photoresist deviates from the desired shape, any one or a combination of adjustments along the adjusting axes of a, b, c, d, e and f can be set. Another photomask is formed and then the photomask is used to expose the photoresist. The process is repeated until the pattern on the photoresist layer matches the desired shape.

Figure 7A:
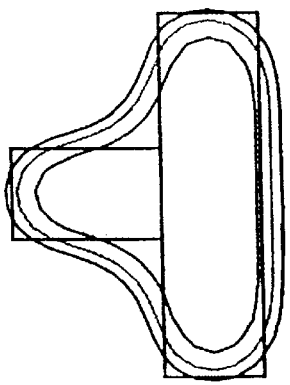
FIGS. 7A through 7C are diagrams showing the distribution of light intensity around patterns having layouts according to FIGS. 5A, 6A and 6B, where the distribution is obtained through a computer simulation with the outer bands showing higher light intensity.
Figure 7B:
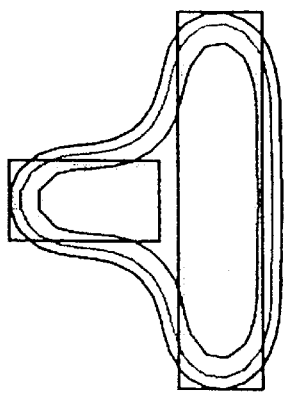
Figure 7C:
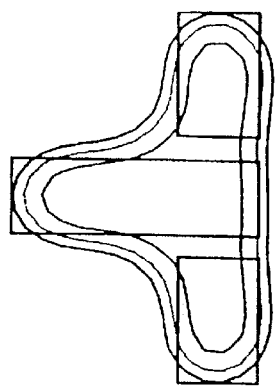

FIGS. 7A through 7C are diagrams showing the distribution of light intensity around patterns having layouts according to FIGS. 5A, 6A and 6B. The distribution is obtained through a computer simulation with the outer bands having a higher light intensity. The contour lines link up places of equal light intensity.

Figure 8A:
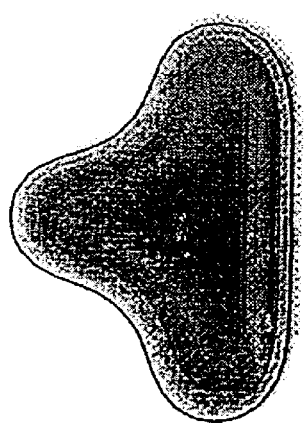
FIGS. 8A through 8C are computer-generated images of the light intensity distribution according to the patterns in FIGS. 7A through 7C, respectively.
Figure 8B:
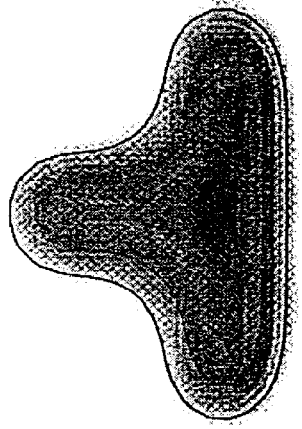
Figure 8C:
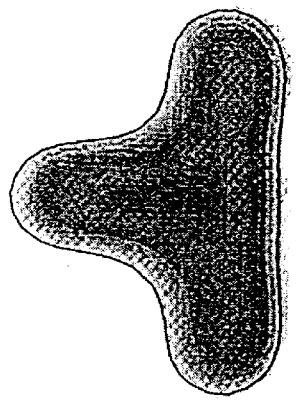

FIGS. 8A through 8C are computer-generated images of the light intensity distribution according to the patterns in FIGS. 7A through 7C, respectively. As shown in FIGS. 8A through 8C, the pattern on the photoresist improves considerably after treating the photomask according the method of this invention. There is notable difference in the degree of rounding around the corner regions between a pattern formed by a treated photomask (as shown in FIGS. 8B and 8C) and one formed by a conventional photomask.

The foregoing description is only one of examples to correct the photoresist pattern. In general, when one want to design a pattern on a mask, the pattern is distorted due to, i.e., the optical proximity effect. In the method of the invention, the ideal primary pattern is divided into several sub-patterns. Then, at least one of the sub-patterns can be rectified by spacing apart. As a result, the light intensity under the light exposure is modified to have the desired pattern with better and clear light intensity as shown in comparison between FIG. 8A and FIG. 8C. The angled corners are not smeared away.

Actually, the shape of the sub-patterns of the invention is also not restricted to a rectangular shape. The sub-patterns can include, for example, polygon shape, rectangular shape, trapezoid shape, or parallelogram shape, as a design choice.

The techniques for rectifying the area of the at least one of the sub-pattern can also include OPC technique, halftone-mask technique, PSM technique, adding assisting features, binary technique, chrome on glass technique, or levenson technique, which techniques by themselves should be known by the skilled artisans. In more details, the way of adding assisting features is about adding additional sub-patterns to enhance the weak point according to the principle of the invention. The binary technique usually refers a 0/1 pattern. The "0" indicates the transparent area and the "1" indicates the shielding area. The chrome on glass technique is one of the binary technique, in which the chrome material is used as the shielding layer. The levenson technique is a PSM technique combined with the chrome on glass technique, and is also called alternating PSM. The rim PSM is also a technique which combined with the chrome on glass and PSM techniques. The half-tone technique is using a half-tone material to reduce exposure light intensity. This half-tone technique can be combined with PSM technique to have an attenuated PSM. The techniques for forming the mask are known by the skilled artisans as tools. However, the method associating with the mask making techniques to design a desired pattern is novel and non-obvious.

In summary, the advantages of the invention at least includes:

1. The optical proximity correction of this invention can produce a high-quality pattern without the need to perform a sophisticated computer simulation.

2. The method can effectively eliminate distortion that results from light diffraction and dispersion.

3. Since the components for rectifying pattern on a photoresist are simple geometric figures, the photomask can have a higher manufacturing precision.

4. Better control of critical dimension on the photomask or the photoresist can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of designing a pattern on a mask, comprising:
   dividing the pattern into sub-patterns; and
   rectifying an area of at least one of the sub-patterns to have the sub-patterns being spaced apart for modifying a light intensity distribution with respect to the pattern.

2. The method of claim 1, wherein the pattern has at least one corner structure.

3. The method of claim 1, wherein one of the sub-patterns has a polygon shape.

4. The method of claim 3, wherein one of the polygon shape includes a rectangular shape.

5. The method of claim 3, wherein one of the polygon shape includes a trapezoid shape.

6. The method of claim 3, wherein one of the polygon shape includes a parallelogram shape.

7. The method of claim 1, wherein the step of rectifying the area of at least one of the sub-patterns includes an optical proximity correction (OPC) technique.

8. The method of claim 1, wherein the step of rectifying the area of at least one of the sub-patterns includes a halftone-mask technique.

9. The method of claim 1, wherein the step of rectifying the area of at least one of the sub-patterns includes a phase shift mask (PSM) technique.

10. The method of claim 1, wherein the step of rectifying the area of at least one of the sub-patterns includes adding an assistant pattern.

11. The method of claim 1, wherein the step of rectifying the area of at least one of the sub-patterns includes a binary technique.

12. The method of claim 1, wherein the step of rectifying the area of at least one of the sub-patterns includes a chrome on glass technique.

13. The method of claim 1, wherein the step of rectifying the area of at least one of the sub-patterns includes a levenson technique.

14. A method of designing a pattern on a mask, comprising:

dividing the pattern into sub-patterns; and relocating an area of at least one of the sub-patterns to have the sub-patterns being spaced apart for modifying a light intensity distribution with respect to the pattern.

15. The method of claim 14, wherein the pattern has at least one corner structure.

16. The method of claim 14, wherein one of the sub-patterns has a polygon shape.

17. The method of claim 16, wherein one of the polygon shape includes a rectangular shape.

18. The method of claim 16, wherein one of the polygon shape includes a trapezoid shape.

19. The method of claim 16, wherein one of the polygon shape includes a parallelogram shape.

20. The method of claim 14, wherein the step of rectifying the area of at least one of the sub-patterns includes an optical proximity correction (OPC) technique.

21. The method of claim 14, wherein the step of relocating the area of at least one of the sub-patterns includes a halftone-mask technique.

22. The method of claim 14, wherein the step of relocating the area of at least one of the sub-patterns includes a phase shift mask (PSM) technique.

23. The method of claim 14, wherein the step of relocating the area of at least one of the sub-patterns includes adding an assistant pattern.

24. The method of claim 14, wherein the step of relocating the area of at least one of the sub-patterns includes a binary technique.

25. The method of claim 14, wherein the step of relocating the area of at least one of the sub-patterns includes a chrome on glass technique.

26. The method of claim 14, wherein the step of relocating the area of at least one of the sub-patterns includes a levenson technique.

* * * * *